United States Patent
Smith et al.

(10) Patent No.: US 11,477,868 B2
(45) Date of Patent: Oct. 18, 2022

(54) CURRENT CONTROL CIRCUITRY

(71) Applicant: Cirrus Logic International Semiconductor Ltd., Edinburgh (GB)

(72) Inventors: Dave Smith, Edinburgh (GB); Saurabh Singh, Edinburgh (GB); Andrew Buist, Edinburgh (GB); Paulius Cerebiejus, Edinburgh (GB); Mark J. McCloy-Stevens, Edinburgh (GB); Terence A. Orr, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/123,429

(22) Filed: Dec. 16, 2020

(65) Prior Publication Data
US 2021/0219396 A1    Jul. 15, 2021

Related U.S. Application Data

(60) Provisional application No. 62/959,350, filed on Jan. 10, 2020, provisional application No. 62/982,788, filed on Feb. 28, 2020.

(51) Int. Cl.
*H05B 45/10* (2020.01)
*H05B 45/34* (2020.01)
(Continued)

(52) U.S. Cl.
CPC ............. *H05B 45/345* (2020.01); *H03F 3/04* (2013.01); *H03F 2200/129* (2013.01)

(58) Field of Classification Search
CPC ........ H05B 45/00; H05B 45/10; H05B 45/34; H05B 45/345; H03F 3/04; H03F 2200/129
See application file for complete search history.

(56) References Cited

U.S. PATENT DOCUMENTS 7,145,295 B1 * 12/2006 Lee .................. H05B 45/10
315/DIG. 4
2008/0284408 A1  11/2008 Kunst et al.
(Continued)

FOREIGN PATENT DOCUMENTS

EP    2456287 A2    5/2012
EP    2765834 A1    8/2014

OTHER PUBLICATIONS

International Search Report and Written Opinion of the International Searching Authority, International Application No. PCT/GB2021/050077, dated Apr. 21, 2021.

*Primary Examiner* — Jimmy T Vu
(74) *Attorney, Agent, or Firm* — Jackson Walker L.L.P.

(57) ABSTRACT

The present disclosure relates to current control circuitry for controlling a current through a load. The current control circuitry comprises amplifier circuitry, reference voltage generator circuitry configured to supply a fixed reference voltage to a first input of the amplifier circuitry and an output stage comprising: a control terminal coupled to an output of the amplifier circuitry; a current input terminal configured to be coupled to the load; and a current output terminal. The current control circuitry further comprises a variable resistance coupled to the current output terminal of the output stage, and a feedback path between the current output terminal of the output stage and a second terminal of the amplifier circuitry for providing a feedback voltage to a second input of the amplifier circuitry.

19 Claims, 18 Drawing Sheets

(51) Int. Cl.
H05B 45/345 (2020.01)
H03F 3/04 (2006.01)

(56) References Cited

U.S. PATENT DOCUMENTS

| | | |
|---|---|---|
| 2010/0283773 A1* | 11/2010 | Kim ........................ G09G 3/20 |
| | | 345/211 |
| 2013/0114016 A1 | 5/2013 | Lim et al. |
| 2016/0078821 A1 | 3/2016 | Lee et al. |

* cited by examiner

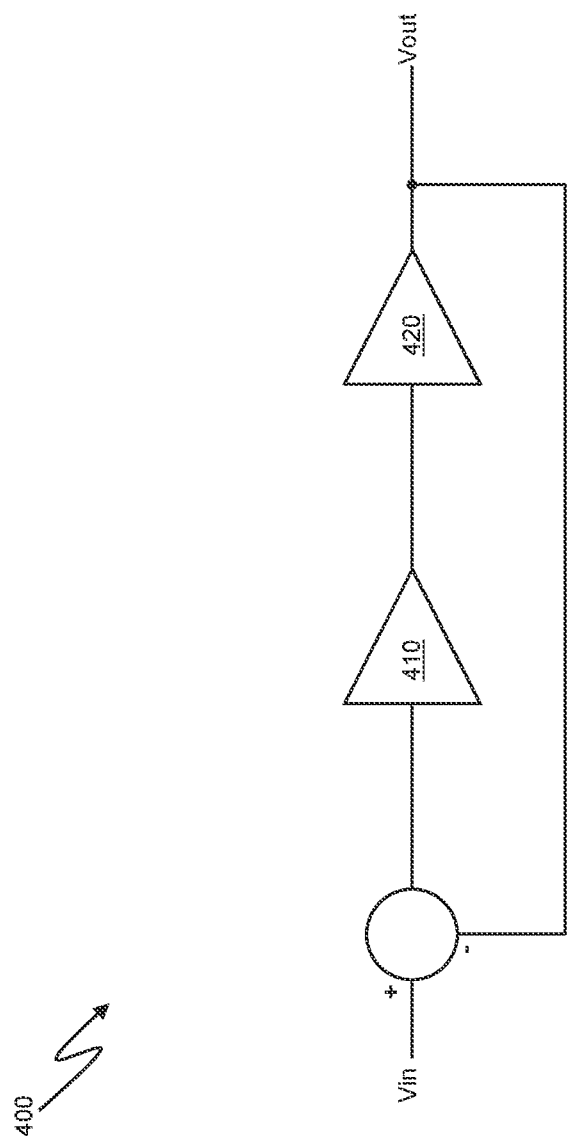

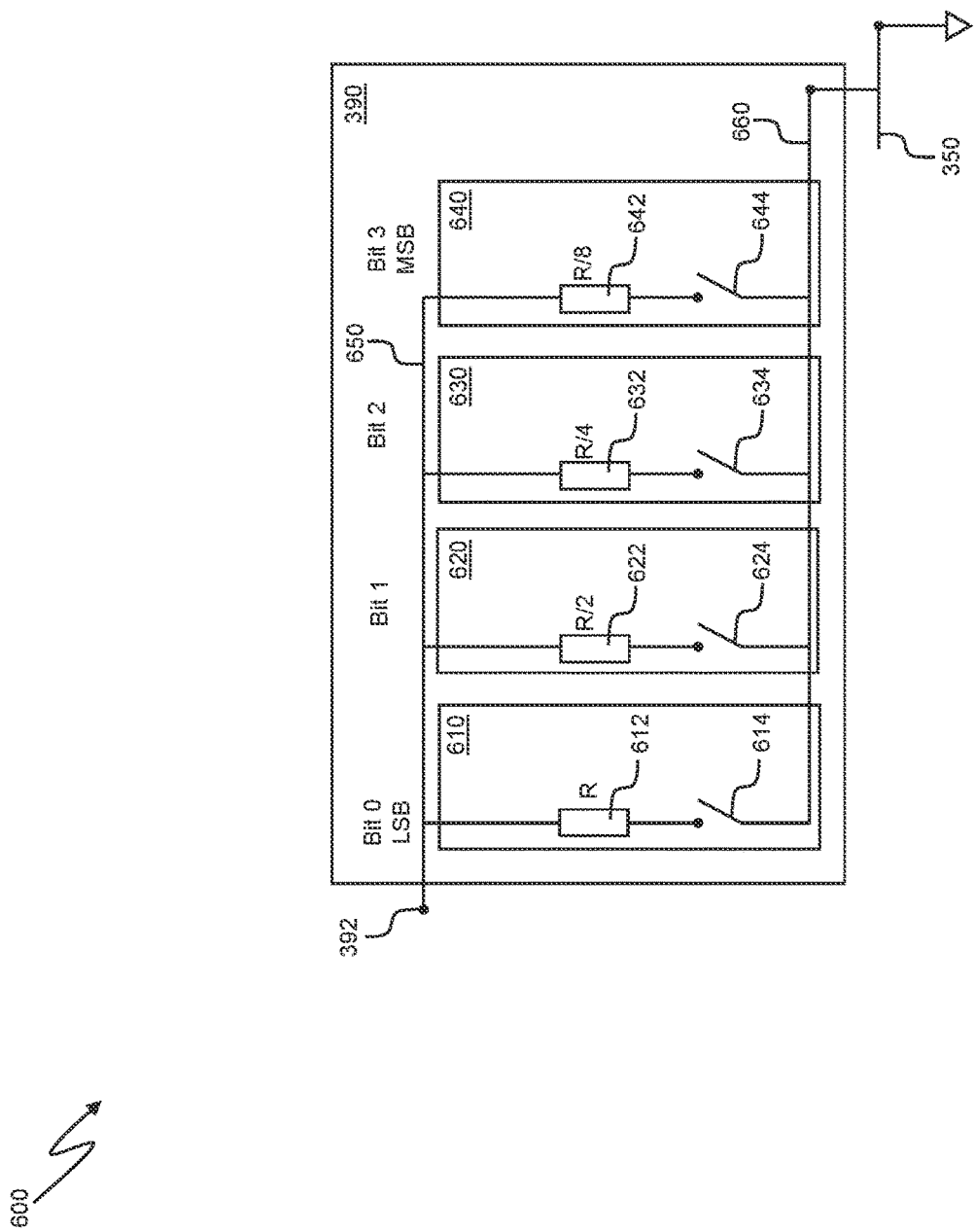

CURRENT CONTROL CIRCUITRY

FIELD OF THE INVENTION

The present disclosure relates to the field of current control circuitry.

BACKGROUND

A current sink is a port or circuit that accepts a negative current, e.g. a current that flows into the current sink is drained to ground. Current sink driver circuitry can be used to drive a load such as, for example, an LED (light emitting diode). Current sink driver circuitry may be configured to control an amount of current that flows through the load. For example, where current sink driver circuitry is used to drive an LED, the current through the LED may be controllable so as to control the brightness of the LED.

SUMMARY

According to a first aspect, the invention provides current control circuitry for controlling a current through a load, the current control circuitry comprising:
  amplifier circuitry;
  reference voltage generator circuitry configured to supply a fixed reference voltage to a first input of the amplifier circuitry;
  an output stage comprising:
    a control terminal coupled to an output of the amplifier circuitry;
    a current input terminal configured to be coupled to the load; and
    a current output terminal;
  a variable resistance coupled to the current output terminal of the output stage; and
  a feedback path between the current output terminal of the output stage and a second terminal of the amplifier circuitry for providing a feedback voltage to a second input of the amplifier circuitry.

The reference voltage generator may circuitry comprise:
  a current source configured to generate a fixed current; and
  a resistance.

The output stage may comprise a MOSFET device.

A resistance value of the variable resistance may be digitally controllable.

The variable resistance may comprise a resistive digital to analogue converter (DAC).

A resistance of the resistive DAC may be based on a digital code input to the resistive DAC.

The resistive DAC may be configured to receive a clock signal.

A change in a resistance of the resistive DAC in response to a change in the digital code input to the resistive DAC may be synchronised to the clock signal.

The current control circuitry may further comprise a switch, operable to couple the first and second inputs of the amplifier circuitry during a change from one digital code input to the resistive DAC to another digital code input to the resistive DAC.

The current control circuitry may further comprise a current sense resistor coupled in series between the variable resistance and ground. The current sense signal is configured to generate a signal indicative of the current through the load.

The current control circuitry may further comprise processing circuitry configured to adjust the operation of the current control circuitry based on the signal indicative of the current through the load.

The processing circuitry may be configured to reduce a supply voltage or power down the current control circuitry in response to determining that the current through the load exceeds a predetermined threshold.

The processing circuitry may be configured to adjust an operating parameter of the current control circuitry to reduce an error between a measured current through the load and a predefined current value.

For example, the processing circuitry may be operative to adjust one or more of:
  a gain of the amplifier circuitry;
  a reference current that is used to generate the reference voltage;
  a resistance value of a resistance that is used to generate the reference voltage;
  a supply voltage to a portion of the current control circuitry; and
  a resistance value of the variable resistance.

The current sense resistor may be of a different type than the variable resistance.

For example, the current sense resistor may be a TaN (tantalum nitride) resistor.

The current control circuitry may be configured to receive a first power supply voltage for powering the reference voltage generator circuitry and a second power supply voltage for supplying current to the load.

The load may be a light emitting diode (LED).

According to a second aspect, the invention provides current control circuitry for controlling a current through a load, the current control circuitry comprising:
  amplifier circuitry;
  reference voltage generator circuitry configured to supply a reference voltage to a first input of the amplifier circuitry;
  an output stage comprising:
    a control terminal coupled to an output of the amplifier circuitry;
    a current input terminal configured to be coupled to the load; and
    a current output terminal;
  a feedback path between the current output terminal of the output stage and a second terminal of the amplifier circuitry for providing a feedback voltage to a second input of the amplifier circuitry; and
  a current sense resistor coupled to ground in a current path for the load current.

According to a second aspect, the invention provides an integrated circuit comprising current control circuitry according to the first or second aspect.

According to a fourth aspect, the invention provides an electronic device comprising an integrated circuit according to the third aspect.

The device may comprise a mobile telephone, a tablet or laptop computer, a wearable device, a gaming device, a virtual reality or augmented reality device, for example.

BRIEF DESCRIPTION OF THE DRAWINGS

Embodiments of the invention will now be described, strictly by way of example only, with reference to the accompanying drawings, of which:

FIG. 4 is a schematic diagram illustrating a model of amplifier circuitry and an output stage of the current control circuitry of FIG. 3;

FIG. 6 is a schematic diagram illustrating a resistive digital to analogue converter suitable for use as a variable resistance in the current control circuitry of FIG. 3;

DETAILED DESCRIPTION

Figure 1:
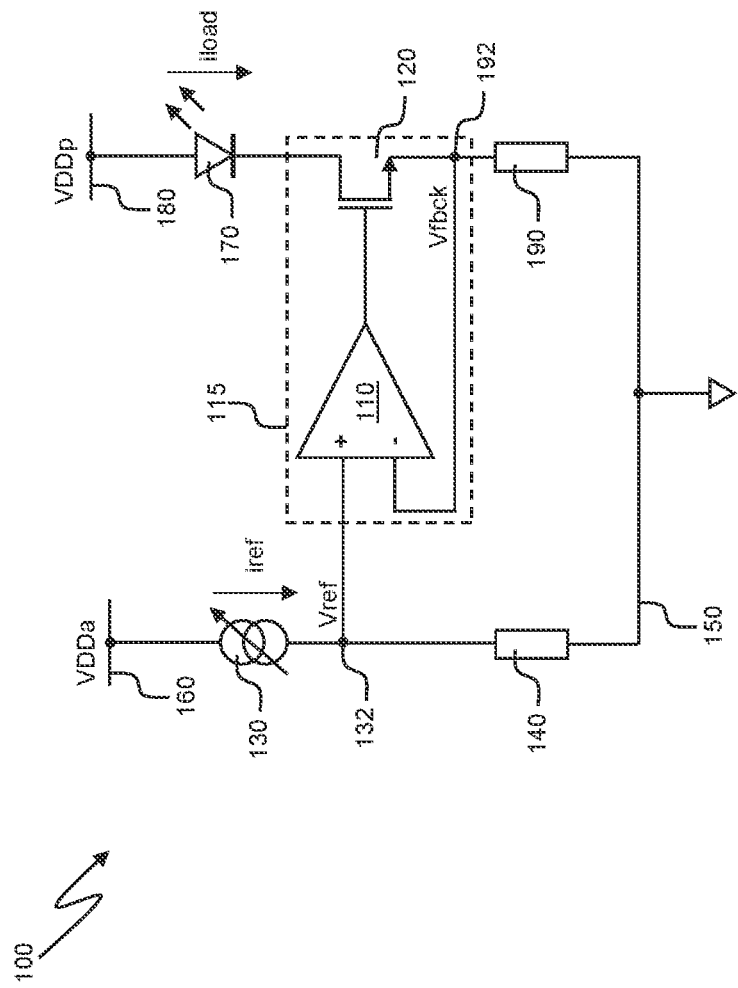
FIG. 1 is a schematic diagram illustrating example current control circuitry.

Referring first to FIG. 1, an example of current control circuitry is shown generally at 100. The current control circuitry 100 comprises amplifier circuitry 110 having an output that is coupled to a control (e.g. gate) terminal of an output stage 120, which in the illustrated example is a MOSFET device.

The current control circuitry 100 further includes voltage generator circuitry, which in the illustrated example comprises a controllable current source 130 coupled in series with a first resistance 140 between a first supply voltage rail 140, which provides a first supply voltage VDDa and a ground (or other reference) supply rail 150. A first node 132 intermediate the controllable current source 120 and the first resistance 130 is coupled to a first (non-inverting) input terminal of the amplifier circuitry 110.

A load 170, which in the illustrated example is an LED, is coupled between a second supply voltage rail 180 and a drain terminal of the output stage 120. The second supply voltage rail 180 in this example provides a second supply voltage VDDp.

A second resistance 190 is coupled between a source terminal of the output stage 120 and the ground (or other reference) supply rail 150. A second node 192 intermediate the source terminal of the output stage and the second resistance 190 is coupled to a second (inverting) input of the amplifier circuitry 110. Thus a feedback path is provided between the second node 192 and the second input of the amplifier circuitry 110, by means of which a voltage Vfbck that develops at the second node 192 can be fed back to the amplifier circuitry 110.

On startup of the current control circuitry 100, the controllable current source generates a current iref, which causes a voltage Vref to develop at the first node 132. The voltage Vref is thus supplied to the non-inverting input of the amplifier circuitry 110 as a reference voltage. The output stage 120 is initially switched off, so no current flows through the load 170, and the voltage Vfbck is lower than the reference voltage Vref. The amplifier circuitry 110 thus outputs a positive voltage to the control (gate) terminal of the output stage as a bias voltage, to drive the output stage. Consequently a current iload flows through the load and the second resistance 190, and the voltage Vfback develops at the second node 192.

The feedback arrangement of the amplifier circuitry 110 acts to minimise any difference between the reference voltage Vref and the voltage Vfbck, by causing the amplifier circuitry 110 to adjust its output voltage which, as discussed above, is received by the control terminal of the output stage 120 as its bias voltage. Adjusting the bias voltage to the control terminal of the output device 120 changes the load current iload. Thus the amplifier circuitry 110 is operative to maintain a constant load current iload for a given reference current iref.

In order to change the load current iload, the reference current iref is adjusted, by providing an appropriate control input (e.g. a control signal) to the controllable current source 130.

Increasing the reference current iref causes the reference voltage Vref at the first input of the amplifier circuitry 110 to increase, which in turn causes the voltage at the output of the amplifier circuitry 110 to increase (as the reference voltage Vref at the non-inverting input of the amplifier circuitry is now greater than the voltage Vfbck at the inverting input of the amplifier circuitry 110). Thus the bias voltage supplied to the control terminal of the output stage 120 increases, thereby increasing the load current iload.

Conversely, decreasing the reference current iref causes the reference voltage Vref at the first input of the amplifier circuitry 110 to decrease, which in turn causes the voltage at the output of the amplifier circuitry 110 to decrease (as the reference voltage Vref at the non-inverting input of the amplifier circuitry is now smaller than the voltage Vfbck at the inverting input of the amplifier circuitry 110). Thus the bias voltage supplied to the control terminal of the output stage 120 decreases, thereby decreasing the load current iload.

As will be appreciated, the rate at which the load current iload can be changed in the current control circuitry 100 (i.e. diload/dt) is limited by the bandwidth of the feedback loop of the amplifier circuitry 110, and thus the current control circuitry 100 may not be suited to applications in which a high rate of change of the load current iload is required.

Figure 2:
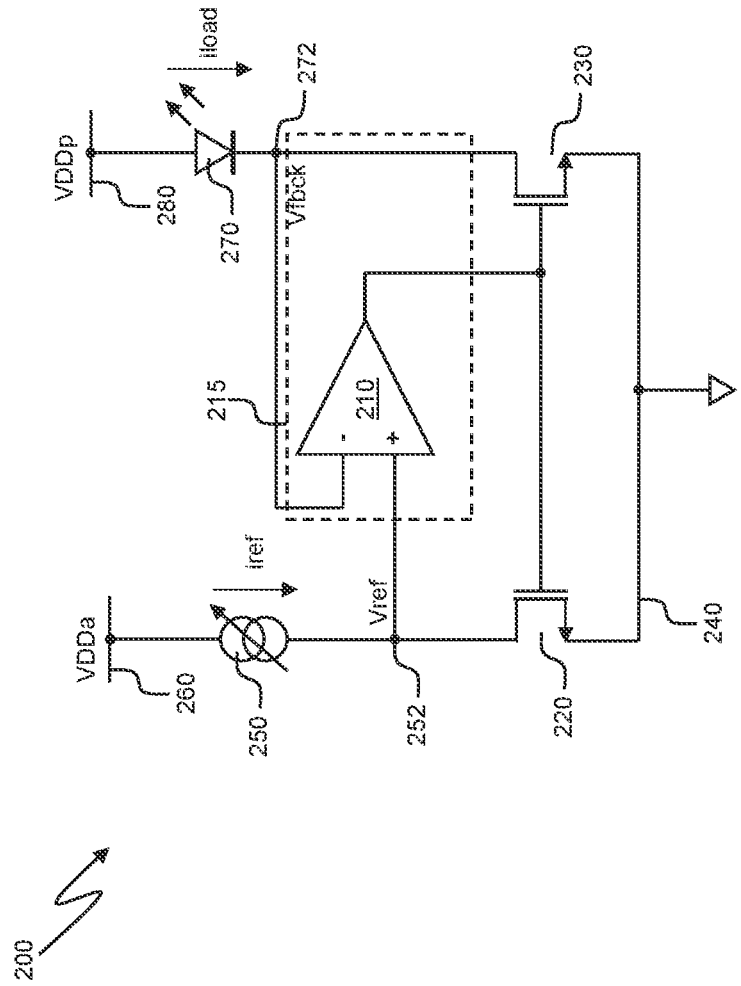
FIG. 2 is a schematic diagram illustrating alternative example current control circuitry.

FIG. 2 shows an alternative example of current control circuitry. The current control circuitry, shown generally at 200 in FIG. 2, comprises amplifier circuitry 210 having an output that is coupled to control (e.g. gate) terminals of matched (in terms of device properties such as channel width and length) first and second MOSFET devices 220, 230. Source terminals of the first and second MOSFET devices are coupled to a ground (or other reference) rail 240. Thus the first and second MOSFET devices 220, 230 are arranged as a current mirror.

A controllable current source 250 is coupled between a first supply voltage rail 260 and a drain terminal of the first MOSFET device 220. The first supply voltage rail 260 in this example provides a first supply voltage VDDa. A node 252 intermediate the controllable current source 250 and the drain terminal of the first MOSFET device 220 is coupled to a first (non-inverting) input of the amplifier circuitry 210.

A load 270, which in the illustrated example is an LED, is coupled between a second supply voltage rail 280 and a drain terminal of the second MOSFET device 230. The second supply voltage rail 280 in this example provides a second supply voltage VDDp. A node 272 intermediate the load 270 and the drain terminal of the second MOSFET device 230 is coupled to a second (inverting) input of the amplifier circuitry 210. Thus a feedback path is provided between the second node 272 and the second input of the amplifier circuitry 210, by means of which a voltage Vfbck that develops at the second node 272 can be fed back to the amplifier circuitry 210.

On startup of the current control circuitry 200, the controllable current source 250 generates a current iref, which causes a voltage Vref to develop at the first node 252. The voltage Vref is thus supplied to the non-inverting input of the amplifier circuitry 210 as a reference voltage. Assuming that the voltage Vfbck is lower than the reference voltage Vref, the amplifier circuitry 210 thus outputs a positive bias voltage to the control (gate) terminal of the first and second MOSFET devices 220, 230, to drive the first and second MOSFET devices 220, 230. Consequently a current iload, which is a copy of the current iref (due to the current mirror arrangement of the first and second MOSFETs 220, 230) flows through the load 270, and the voltage Vfback develops at the second node 272.

The feedback arrangement of the amplifier circuitry 210 acts to minimise any difference between the reference voltage Vref and the voltage Vfbck, by causing the amplifier circuitry 210 to adjust its output voltage which, as discussed above, is received as a bias voltage by the control terminals of the first and second MOSFET devices 220, 230.

In order to change the load current iload, the reference current iref is adjusted, by providing an appropriate control input (e.g. a control signal) to the controllable current source 250.

Increasing the reference current iref causes the reference voltage Vref at the first input of the amplifier circuitry 210 to increase, which in turn causes the voltage at the output of the amplifier circuitry 210 to increase (as the reference voltage Vref at the non-inverting input of the amplifier circuitry is now greater than the voltage Vfbck at the inverting input of the amplifier circuitry 110). Thus the bias voltage supplied to the control terminals of the first and second MOSFET devices 220, 230 increases, thereby increasing the load current iload.

Conversely, decreasing the reference current iref causes the reference voltage Vref at the first input of the amplifier circuitry 210 to decrease, which in turn causes the voltage at the output of the amplifier circuitry 210 to decrease (as the reference voltage Vref at the non-inverting input of the amplifier circuitry is now smaller than the voltage Vfbck at the inverting input of the amplifier circuitry 210). Thus the bias voltage supplied to the control terminals first and second MOSFET devices 220, 230 decreases, thereby decreasing the load current iload.

In a practical implementation of the circuitry 200 the matching between the first and second MOSFET devices 220, 230 is typically not perfect. There may be a difference of as much as 10% between the relevant characteristics of the first and second MOSFET devices 220, 230. As will be appreciated, such imperfect matching will adversely affect the accuracy with which the load current iload can be controlled. Additionally, the rate at which the load current iload can be changed in the current control circuitry 100 (i.e. diload/dt) is limited by the bandwidth of the feedback loop of the amplifier circuitry 210. Thus the current control circuitry 200 may not be suited to applications in which a high degree of accuracy of the load current iload, or a high rate of change of the load current iload, is required.

Figure 3:
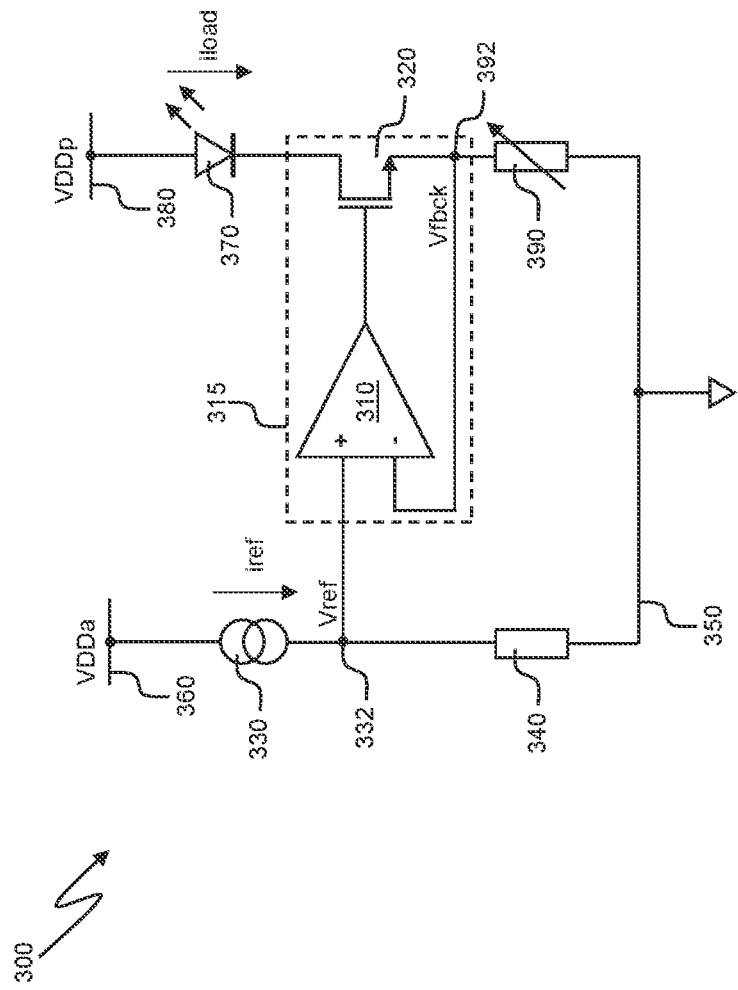
FIG. 3 is a schematic diagram illustrating example current control circuitry according to the present disclosure.

FIG. 3 is a schematic representation of an example of current control circuitry according to the present disclosure.

The circuitry, shown generally at 300 in FIG. 3, comprises amplifier circuitry 310 having an output that is coupled to a control (e.g. gate) terminal of an output stage 320, which in the illustrated example is a MOSFET device.

The current control circuitry 300 further includes voltage generator circuitry, which in the illustrated example comprises a current source 330 coupled in series with a first resistance 340 between a first supply voltage rail 360, which provides a first supply voltage VDDa and a reference supply rail 350, which in this example is coupled to ground. In contrast to the circuitry 100 of FIG. 1, the current source 330 is configured to generate a fixed current.

A first node 332 intermediate the controllable current source 320 and the first resistance 330 is coupled to a first (non-inverting) input terminal of the amplifier circuitry 310.

A load 370, which in the illustrated example is an LED, is coupled between a second supply voltage rail 380 and a drain terminal of the output stage 320. The second supply voltage rail 380 in this example provides a second supply voltage VDDp.

A variable resistance 390 is coupled between a source terminal of the output stage 320 and the reference supply rail 350. A second node 392 intermediate the source terminal of the output stage and the variable resistance 390 is coupled to a second (inverting) input of the amplifier circuitry 310. Thus a feedback path is provided between the second node 392 and the second input of the amplifier circuitry 310, by means of which a voltage Vfbck that develops at the second node 392 can be fed back to the amplifier circuitry 310.

On startup of the current control circuitry 300, the current source generates a current iref, which causes a voltage Vref to develop at the first node 332. The voltage Vref is thus supplied to the non-inverting input of the amplifier circuitry 310 as a reference voltage. The output stage 320 is initially switched off, so no current flows through the load 370 and the voltage Vfbck is lower than the reference voltage Vref. The amplifier circuitry 310 thus outputs a positive voltage to the control (gate) terminal of the output stage 320 as a bias voltage, to drive the output stage 320. Consequently a current iload flows through the load 370 and the variable resistance 390, and the voltage Vfback develops at the second node 392.

The feedback arrangement of the amplifier circuitry 310 acts to minimise any difference between the reference voltage Vref and the voltage Vfbck, by causing the amplifier circuitry 310 to adjust its output voltage which, as discussed above, is received by the control terminal of the output stage 320 as its bias voltage.

In order to change the load current iload, the value of the variable resistance 390 is adjusted, by providing an appropriate control input (e.g. a control signal) to the variable resistance 390.

Reducing the value of the variable resistance 390 causes an instantaneous increase in the load current iload. Because the bias voltage to the output stage 320 cannot immediately change in response to the increase in the load current iload, the reduction in the load current iload gives rise to a relatively large voltage decrease in the voltage Vfbck at the second node 392.

As the reference voltage Vref at the non-inverting input of the amplifier circuitry 310 is constant, a large difference now exists between the voltage Vref at the inverting input of the amplifier circuitry and the voltage Vfbck at the non-inverting input of the amplifier circuitry 310. The amplifier circuitry 310 responds quickly to this large difference by increasing the voltage at its output, thus increasing the bias voltage to the output stage 320. The voltage Vfbck at the second node 392 (and thus at the inverting input of the amplifier circuitry 310) thus increases to compensate for the initial large drop in voltage at the second node 392 and therefore equalise the voltages at the inputs to the amplifier circuitry 310.

Increasing the value of the variable resistance 390 causes an instantaneous decrease in the load current iload. Again, because the bias voltage to the output stage 320 cannot immediately change in response to the increase in the load current iload, the decrease in the load current iload gives rise to a relatively large increase in the voltage Vfbck at the second node 392. The amplifier circuitry 310 responds quickly to this large difference by reducing the voltage at its output, thus decreasing the bias voltage to the output stage 320. The voltage Vfbck at the second node 392 (and thus at the inverting input of the amplifier circuitry 310) is thus reduced to compensate for the initial increase in voltage at the second node 392 and therefore equalise the voltages at the inputs to the amplifier circuitry 310.

Thus, in the circuitry 300 of FIG. 3 the rate of change diload/dt of the load current iload is dependent upon the rate at which the value of the variable resistance 390 can be changed. If a suitable variable resistance 390 is employed a much higher rate of change diload/dt of the load current iload than in the circuitry 100 of FIG. 1.

Further, the accuracy of the change in the load current iload is dependent upon the accuracy of the variable resistance 390, rather than being dependent on a matching accuracy between two MOSFET devices, as in the circuitry 200 of FIG. 2. As the accuracy of a resistance is generally much greater than the matching accuracy of two different MOSFET devices, the circuitry 300 can provide greater accuracy in the load current iload than the circuitry 200 of FIG. 2. For example, the matching accuracy between two MOSFET devices may be around 10%, whereas the value of an individual resistor may be within 1% of its nominal or rated value.

Thus the circuitry 300 is able to control the load current iload with greater speed and greater accuracy than the circuitry 100, 200 of FIGS. 1 and 2.

Another factor that contributes to the improved rate of change of the load current iload in the circuitry 300 will now be described with reference to FIG. 4.

The amplifier 310 may be configured as a fixed gain amplifier which amplifies the difference between the signals at its inputs. The output stage 320 acts as an attenuator. Thus the amplifier 310 and output stage 320 can be modelled as a fixed gain amplifier 410 having an output that is coupled to an input of an attenuator 420, as shown in FIG. 4.

Figure 5B:
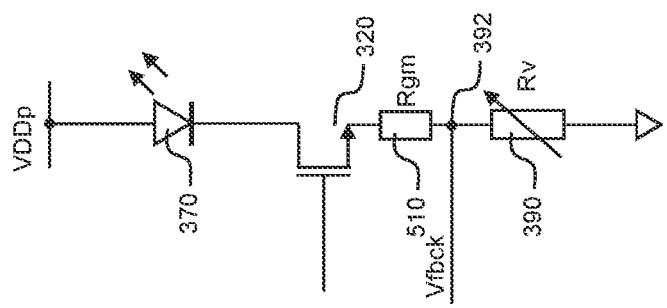
FIG. 5b is a schematic diagram illustrating the effect of a transconductance of the current control circuitry of FIG. 3 with a model.
Figure 5A:
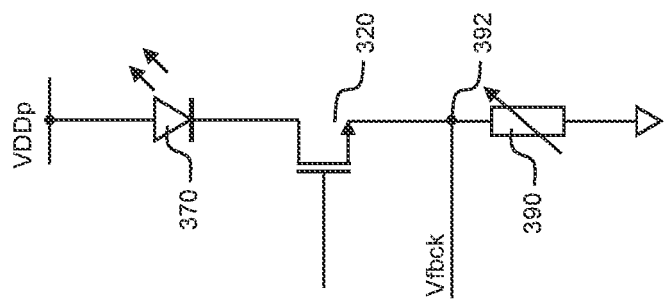
FIG. 5a is a schematic diagram illustrating the output stage, load and variable resistance of the current control circuitry of FIG. 3.

The attenuation in the output stage 320 arises as a result of the transconductance gm of the output stage 320. This can be modelled as a resistance Rgm 510 in series with the variable resistance 370, as shown in FIG. 5b (FIG. 5a shows the output stage 320, load 370 and variable resistance 390 for comparison). The combination of the resistance Rgm 510 and the variable resistance 390 effectively forms a voltage divider, and thus the attenuation that arises due to the resistance Rgm 510 can be calculated as:

$$\text{Attenuation} = \frac{Rv}{Rv + Rgm},$$

Where Rv is the resistance value of the variable resistance 390.

As the resistance Rgm is the reciprocal of the transconductance gm $$\left(\text{i.e. } Rgm = \frac{1}{gm}\right),$$

and the transconductance gm is a function of the current flowing through the output stage 320

$$(\text{e.g. } gm = \sqrt{k \cdot iload}),$$

then it follows that $$\text{Attenuation} = \frac{Rv}{Rv + \frac{1}{\sqrt{k \cdot iload}}}.$$

Thus, as the load current iload decreases as a result an increase in the resistance value Rv of the variable resistance 390, the attenuation tends towards 1.

This is because for a given change in Rv, the resulting change in Rgm will be much smaller, since $$Rgm = \frac{1}{\sqrt{k \cdot \frac{Vfbck}{Rv}}}.$$

Thus, for a small change in the load current iload (resulting from a small change in the value of the variable resistance 390), the attenuation by the output stage 320 has only a very small effect on the voltage Vfbck at the second node 392. The attenuation by the output stage 320 thus does not significantly reduce the loop bandwidth of a loop 315 formed by the amplifier circuitry 310, the output stage 320 and the associated feedback path between the node 392 and the inverting input of the amplifier circuitry 310, and therefore does not significantly affect the speed with which the loop 315 compensates for the change in load current iload.

The variable resistance 390 may be implemented in a number of ways. For example, the variable resistance 390 may be implemented as a resistive digital to analogue converter (DAC), using switched resistances, as illustrated in FIG. 6.

FIG. 6 shows an example of a four-bit resistive DAC 600, which comprises first to fourth banks 610-640 of switched resistances.

The first bank 610 comprises a first resistance 612 of value R coupled in series with a first switch 614 between a first rail 650 that is coupled to the second node 392 of the circuitry 300 and a second rail 660 that is coupled to the reference supply rail 350 of the circuitry 300. Although for clarity the first resistance 612 is shown in FIG. 6 as a single resistor, it will be appreciated by those skilled in the art that the first resistance 612 could be made up of a number of separate resistances coupled in series or parallel in order to achieve the resistance value R.

The second bank 620 comprises a second resistance 622 of value R/2 coupled in series with a second switch 624 between the first rail 650 and the second rail 660. Again, for clarity the second resistance 622 is shown in FIG. 6 as a single resistor, but it will be appreciated by those skilled in the art that the second resistance 622 could be made up of a number of separate resistances coupled in series or parallel in order to achieve the resistance value R/2.

The third bank 630 comprises a third resistance 632 of value R/4 coupled in series with a third switch 634 between the first rail 650 and the second rail 660. As before, for clarity the third resistance 632 is shown in FIG. 6 as a single resistor, but it will be appreciated by those skilled in the art that the third resistance 632 could be made up of a number of separate resistances coupled in series or parallel in order to achieve the resistance value R/4.

The fourth bank 640 comprises a fourth resistance 642 of value R/8 coupled in series with a fourth switch 644 between the first rail 650 and the second rail 660. Again, for clarity the fourth resistance 642 is shown in FIG. 6 as a single resistor, but it will be appreciated by those skilled in the art that the fourth resistance 642 could be made up of a number of separate resistances coupled in series or parallel in order to achieve the resistance value R/8.

The resistance value of the variable resistance 390 can be adjusted by selectively opening and closing the switches 614-644 in accordance with, in this example, a four-bit input digital word or code, and this allows the load current iload to be adjusted in increments equal to 1 LSB (least significant bit) of the resistive DAC. The resistance value of the variable resistance is therefore based on the input digital word or code.

Thus for an input digital word of value 0001, the first switch 614 would be closed and the second, third and fourth switches 624-644 would be open. The resistance value of the variable resistor 390 would thus be equal to R, and the load current iload would be equal to Vref/R (because in steady state operation of the loop 315 Vref=Vfbck).

For an input digital word of value 0010, the second switch 624 would be closed and the first, third and fourth switches 614, 634, 644 would be open. The resistance value of the variable resistor 390 would thus be equal to R/2, and the load current iload would be equal to 2Vref/R.

For an input digital word of value 0011, the first and second switches 614, 624 would be closed and the third and fourth switches 634, 644 would be open. The resistance value of the variable resistor 390 would thus be equal to the parallel combination of R and R/2, i.e. R/3, and the load current iload would be equal to 3Vref/R.

Thus the load current iload can be adjusted in increments of Vref/R. Because the resistances 612-642 can be manufactured with very precise tolerances (whether they are provided as single resistors or serial and/or parallel combinations of multiple resistors), the load current increments can be very accurate.

The use of a resistive DAC 600 as the variable resistance 390 permits digital control of the load current iload. Typically the resistive DAC 600 is configured to receive a clock signal, and so any change in the resistance of the resistive DAC in response to a change in an input digital word or code value is synchronised to the clock signal. Thus the rate of change of the load current iload is dependent upon the clock frequency, in the sense that only one load current increment can be performed per clock cycle. Accordingly, a high rate of change of the load current (i.e. a high diload/dt) can be achieved by using a high-frequency clock.

One issue that can arise when using a resistive DAC to provide the variable resistance 390 is that the resistive DAC can temporarily adopt a high impedance state during transitions between input codes (i.e. during a change from one input digital code value to a different input digital code value), as all of the switches 614-644 may be open simultaneously during the transition, before the appropriate ones of the switches 614-644 are closed to achieve the desired resistance value, thus effectively making the variable resistance 390 open-circuit temporarily.

As a result of this temporary high impedance state, a voltage spike may appear at the second node 392. This causes the voltage Vfbck at the inverting input of the amplifier circuitry 310 to be higher than the reference voltage Vreg at the non-inverting input. The voltage at the output of the amplifier circuitry 310 is thus reduced, reducing the bias voltage to the output stage 320 and thus reducing the load current iload.

Where the change of input code is intended to reduce the value of the variable resistance (i.e. the value of the input code increases) and thus increase the load current iload, this momentary reduction in the load current iload can increase the time required to reach the desired load current iload, because the load current iload has to increase from a lower starting value to the desired value.

Figure 7:
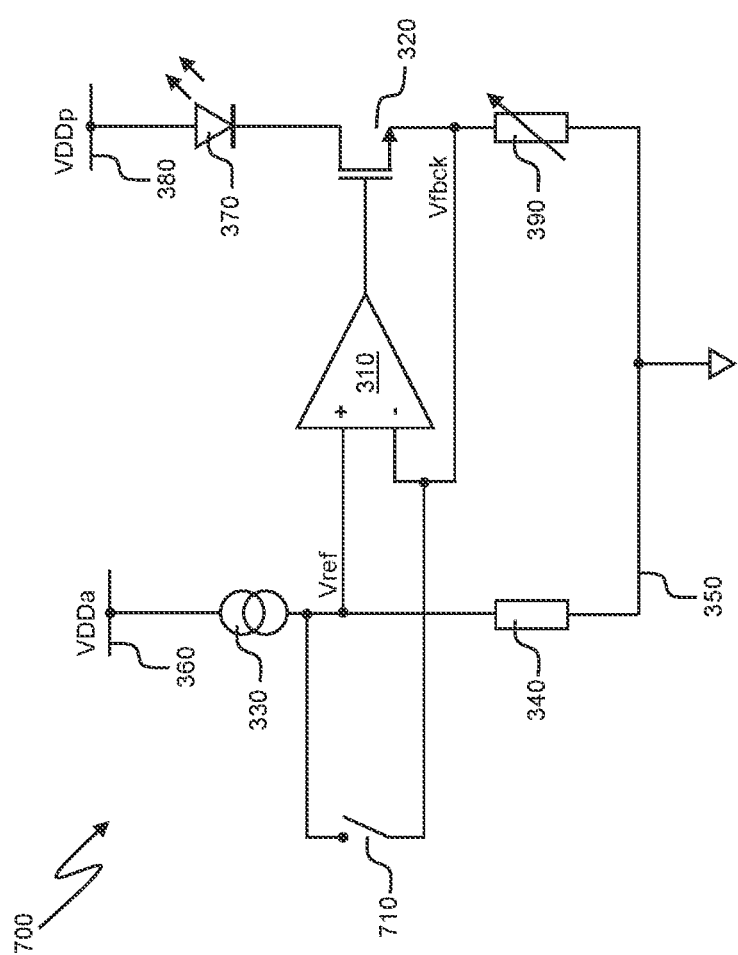
FIG. 7 is a schematic diagram illustrating alternative example current control circuitry according to the present disclosure.

FIG. 7 is a schematic representation of an example of current control circuitry according to the present disclosure that can mitigate this problem. The current control circuitry, shown generally at 700 in FIG. 7, includes a number of features in common with the circuitry 300 of FIG. 3. Such common features are denoted by common reference numerals in FIGS. 3 and 7 and will not be described again here, for the sake of brevity.

The current control circuitry 700 differs from the circuitry 300 of FIG. 3 in that it includes a switch 710 (e.g. a transistor) that is operable to couple (i.e. short-circuit) the first and second inputs of the amplifier circuitry 310. The switch 710 can be actuated during an input code transition (i.e. a change from one input digital code to a resistive DAC implementation of the variable resistance 390) to ensure that the same voltage is received at both of the inputs of the amplifier circuitry 310 during the input code transition, such that the voltage output by the amplifier circuitry 310 does not change during the input code transition, thereby avoiding the momentary reduction in the load current iload described above. Once the input code has settled to the desired value, the switch 710 can be opened, allowing the amplifier circuitry 310 to respond to any difference between the voltages at its inputs that may arise as a result of the change in the input code as described above with reference to FIG. 3.

Figure 8:
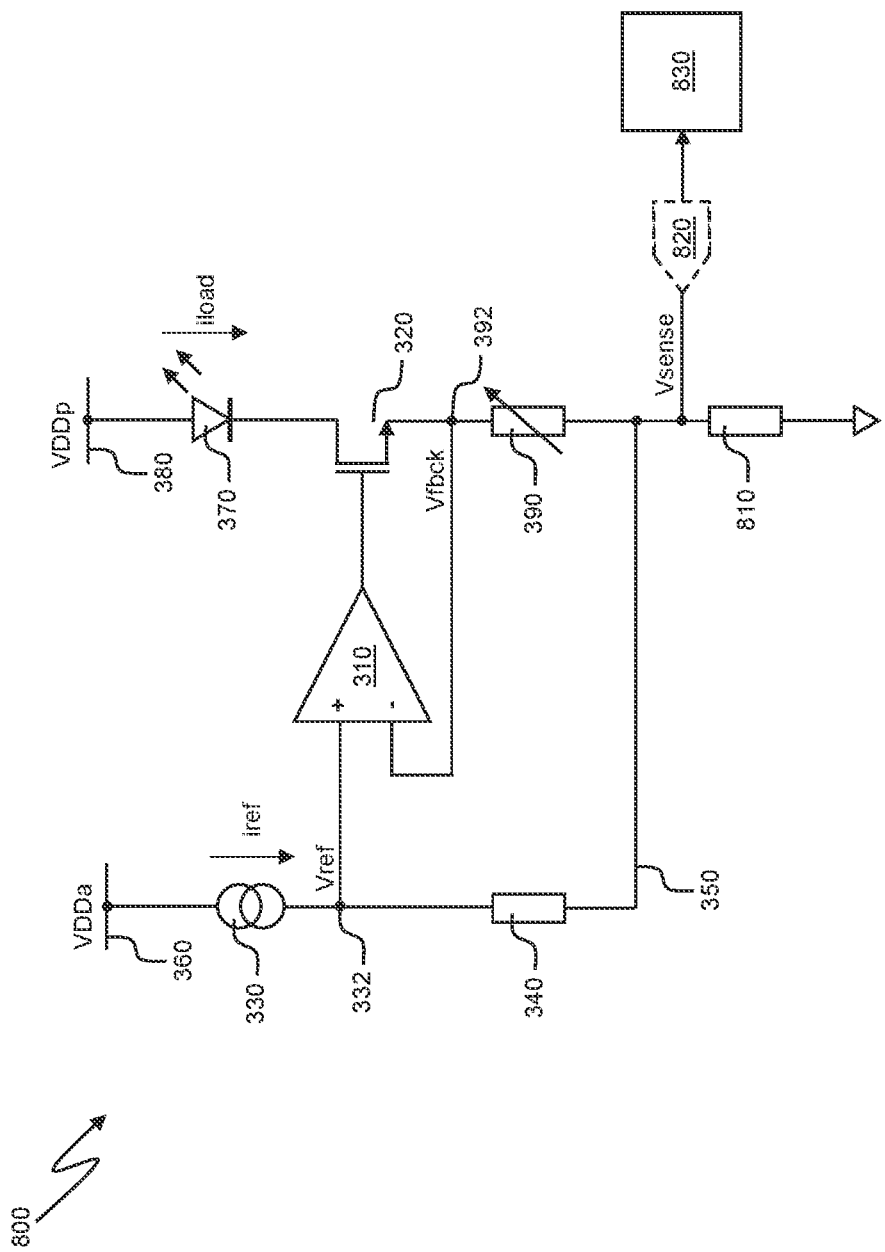
FIG. 8 is a schematic diagram illustrating further alternative example current control circuitry according to the present disclosure.

FIG. 8 is a schematic representation of a further example of current control circuitry according to the present disclosure. The current control circuitry, shown generally at 800 in FIG. 8, includes a number of features in common with the circuitry 300 of FIG. 3. Such common features are denoted by common reference numerals in FIGS. 3 and 8 and will not be described again here, for the sake of brevity.

The current control circuitry 800 differs from the circuitry 300 of FIG. 3 in that the reference supply rail 350 is not coupled directly to ground, but is instead coupled to a first terminal of a sense resistor 810. A second terminal of the sense resistor 810 is coupled to ground. Thus the current sense resistor 810 is coupled between the variable resistance 390 and ground, and is thus coupled to ground in a current path for the load current iload.

In some examples the current sense resistor 810 may be of a different type than the variable resistance 390. For example, the variable resistance may be made up of a plurality of polysilicon (sometimes also referred to simply as poly) resistors, whereas the current sense resistor 810 may be a TaN (tantalum nitride) resistor. As TaN resistors generally have low temperature coefficients, the use of a TaN resistor as the current sense resistor 810 minimises or at least reduces the effect (in comparison to polysilicon resistors, for example) of temperature changes on the accuracy of load current measurement.

The circuitry 800 operates in the same way as the circuitry 300 described above. The presence of the sense resistor 810 does not change the operation of the circuitry, as the amplifier circuitry 310 still receives a constant reference voltage Vref at its non-inverting input, which is compared to a voltage Vfbck, received at the inverting input of the amplifier circuitry 310, that is dependent upon the resistance value of the variable resistance 390.

However, the sense resistor 810 permits the current iload to be measured. Thus a voltage Vsense across the sense resistor 810 can be measured, and an indication of the load current iload can be determined based on the measured voltage Vsense and the resistance value of the sense resistor 810.

Alternatively, an analogue to digital converter (ADC) 820 may be coupled to the first terminal of the sense resistor 810 and configured to convert the analogue voltage Vsense across the sense resistor 810 to a digital output signal that provides an indication of the load current iload.

The indication of the load current iload (whether determined based on the measured voltage Vsense or provided as a digital output of the ADC 820) may be used by processing circuitry 830 to ensure that the load current iload is within specified limits and thus that the load 370 is not drawing excessive current.

The processing circuitry 830 may be, for example, a dedicated microprocessor, microcontroller, state machine or the like, or may alliteratively be a processing resource such as a main processor or an applications processor of a host device that incorporates the circuitry 800.

If the processing circuitry 830 determines that the load current iload is outside of the specified limits (e.g. if the processing circuitry 830 determines that the load current iload exceeds a predetermined threshold, and thus that the load 370 may be drawing excessive current) the processing circuitry 830 may adjust the operation of the circuitry 800, e.g. by powering down the circuitry 800 or reducing the second supply voltage VDDp.

Additionally or alternatively, the indication of the load current iload (whether determined based on the measured voltage Vsense or provided as a digital output of the ADC 820) may be used as a feedback signal to modify or adjust one or more operating parameters of the circuitry 800 so as to improve the accuracy of the load current iload. For example, the processing circuitry 830 may compare the indication of the load current iload to a predefined current value representing a desired or ideal value of the load current iload, and may adjust one or more parameters of the circuitry 800, e.g. the gain of the amplifier circuitry 310, the second supply voltage VDDp, the reference current iref, the resistance value of the resistance 340, or the resistance value of the variable resistance 390, in order to reduce or minimise any error between the measured iload current (as sensed by the sense resistor 810) and the predefined current value representing the desired or ideal value of the load current iload.

Figure 9:
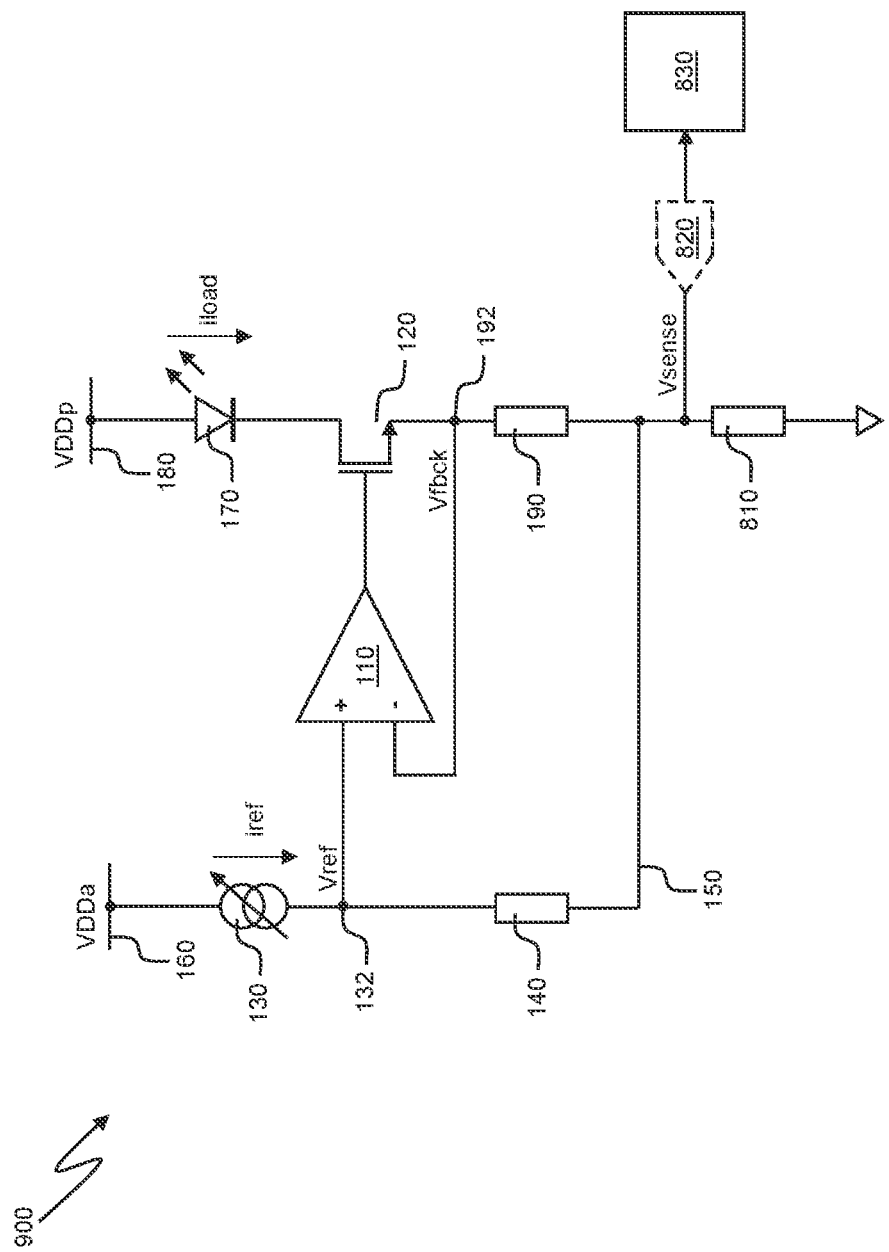
FIG. 9 is a schematic diagram illustrating further alternative example current control circuitry according to the present disclosure.
Figure 10:
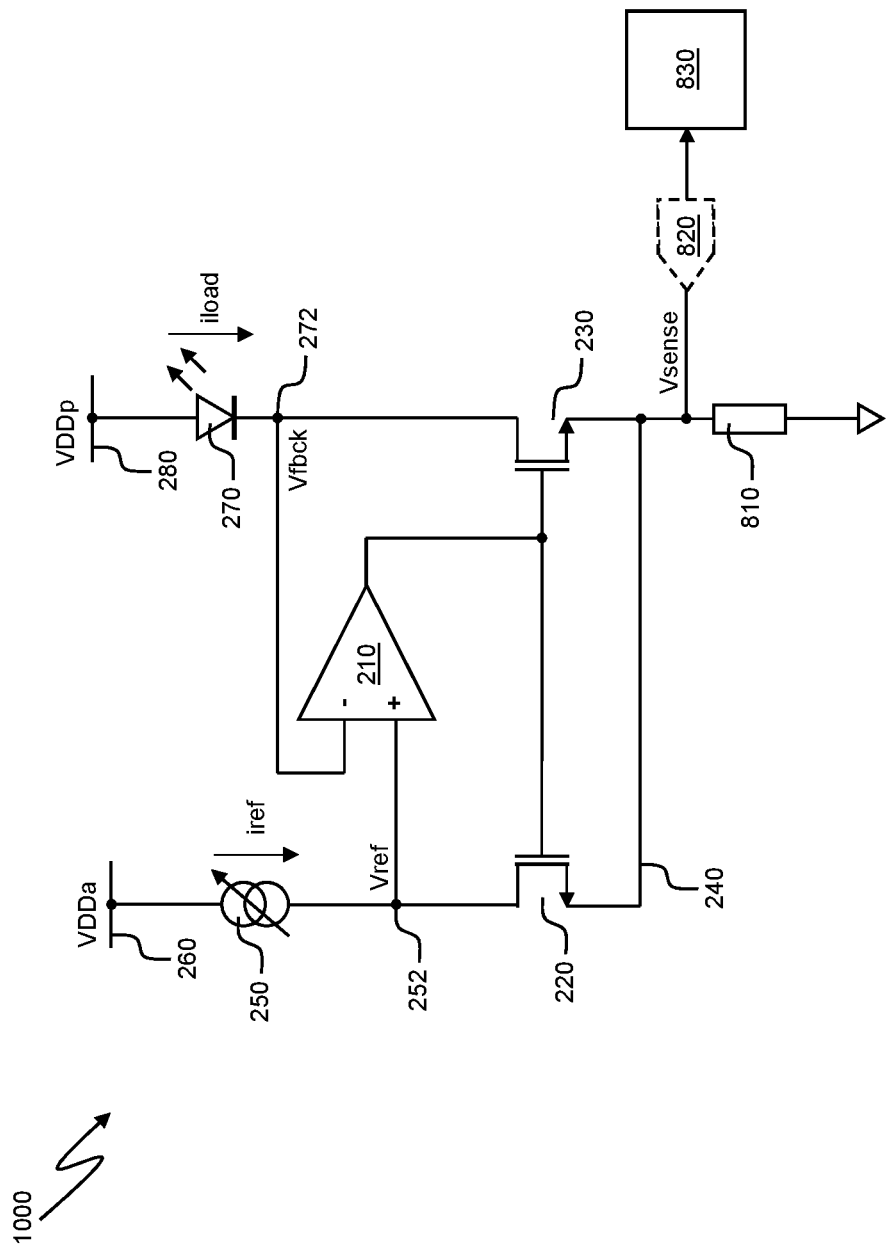
FIG. 10 is a schematic diagram illustrating further alternative example current control circuitry according to the present disclosure.

A similar arrangement of a sense resistor 810, processing circuitry 830 and (optionally) an ADC 820 may be added to the circuitry 100 of FIG. 1 (as illustrated generally at 900 in FIG. 9) or to the circuitry 200 of FIG. 2 (as illustrated generally at 1000 in FIG. 10).

The arrangements 900, 1000 illustrated in FIGS. 9 and 10, in which a current sense resistor 810 is coupled to ground in a current path for the load current iload, permit the load current iload to be measured and the operation of the circuitry 900, 1000 to be adjusted as described above in the event that the processing circuitry 830 determines that the load current iload is outside of the specified limits.

The arrangements 900, 1000 illustrated in FIGS. 9 and 10 also permit one or more operating parameters of the circuitry 100, 200 (e.g. the current iref, a gain of the amplifier circuitry 110, 210, a resistance value of the resistance 140, or a resistance value of the resistance 190) to be adjusted or modified in response to an indication of the load current in order to improve the accuracy of the load current iload, as described above.

In the foregoing description and the accompanying drawings, an LED is used as an example of the load 370. However, it will be appreciated by those of ordinary skill in the art that the circuitry 300, 700, 800 of the present disclosure is equally suitable for driving other loads.

Further, although the example circuitry 300, 700, 800 described above includes first and second supply voltages VDDa, VDDp, it will be appreciated by those of ordinary skill in the art that the circuitry 300, 700, 800 can also operate from a single supply voltage.

As will be apparent from the foregoing description, the current control circuitry of the present disclosure permits fast and highly accurate control of a current through a load.

The use of the variable resistance 390 permits the load current iload to be controlled directly, and thus the speed with which the load current can change is not dependent upon the loop bandwidth of a loop 115, 215 made up of an amplifier, an output stage and an associated feedback path, as in the circuitry 100, 200 shown in FIGS. 1 and 2. In embodiments in which the variable resistance is implemented using a resistive DAC, the rate of change of the load current is dependent upon the frequency of a clock to which the resistive DAC is synchronised. Thus a high rate of change of load current can be achieved if a high frequency clock is employed.

Further, as the current control circuitry of the present disclosure does not use matched MOSFET devices, but instead uses only a variable resistance to control the load current, the accuracy of the load current can be increased, in comparison to the accuracy that is achievable using the circuitry 200 of FIG. 2.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product. In some instances the device could be a gaming device such as a games console, or a virtual reality (VR) or augmented reality (AR) device such as a VR or AR headset, spectacles or the like.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

Further Example Embodiments of the Present Disclosure

The following discussion provides further disclosure relating to current sinks and current sink drivers.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Description

A current sink is a port or circuit that accepts a negative current, e.g. current into the circuit which is drained to ground. Current sink drivers can be used to drive circuit elements, e.g. LEDs. The following describes examples of current sink designs providing high accuracy combined with low voltage headroom requirements.

Figure 11:
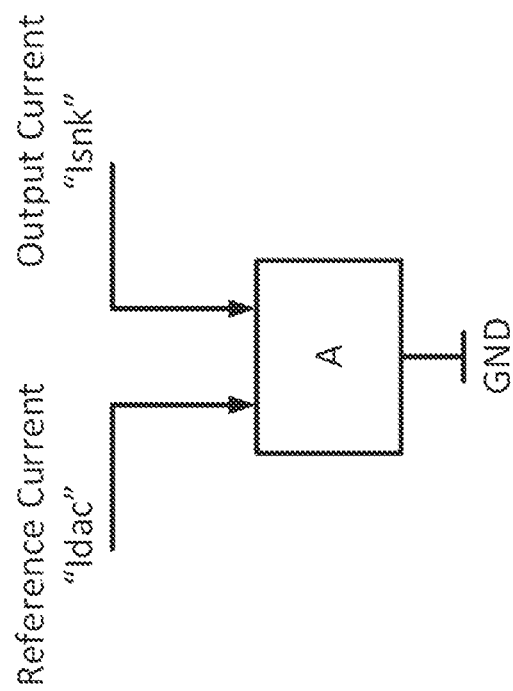
FIG. 11 is a schematic diagram illustrating an implementation of a current sink system.

With reference to FIG. 11, the current sink A receives a reference current Idac, e.g. from a current DAC, and provides a sink for the output current Isnk, where Isnk=A·Idac.

Figure 12:
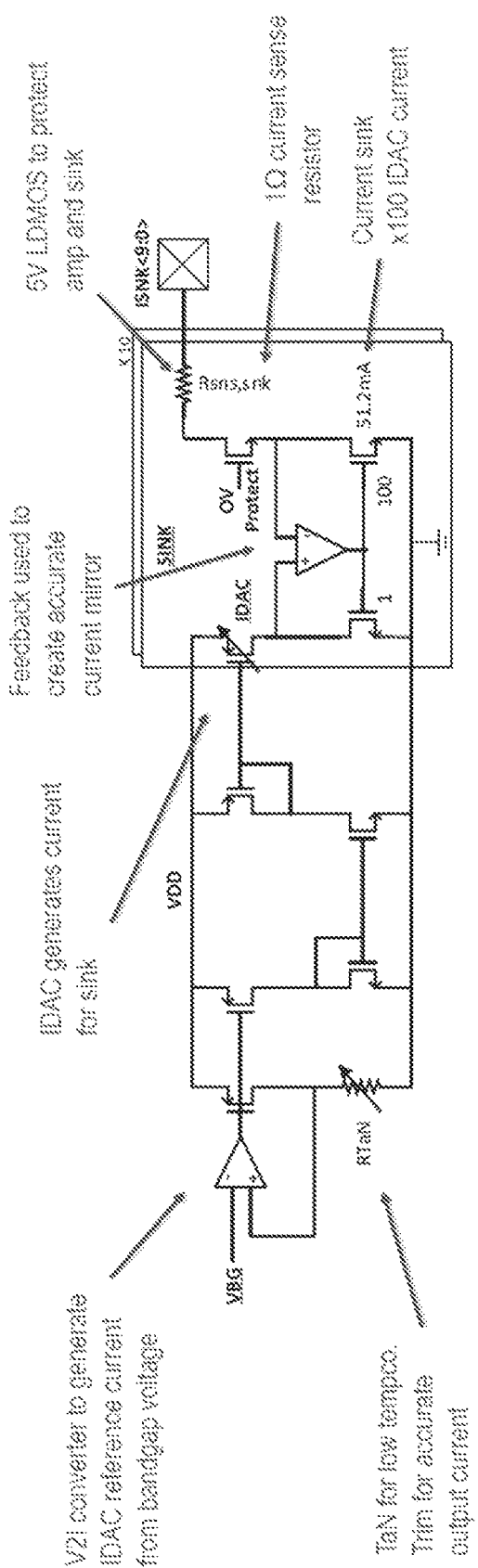
FIG. 12 is a schematic diagram illustrating an alternative implementation of a current sink system.

With reference to FIG. 12, a first implementation of a current source system is shown. A voltage to current (V2I) converter is used to generate a reference current for a current DAC from a bandgap voltage. The V2I converter may be provided with a resistor, such as a TaN resistor, which can be trimmed for accurate current output, e.g. by removing the TaN process variation, V2I converter amplifier input offset and/or initial bandgap voltage error.

The reference current is provided to a current DAC (or IDAC) to generate the reference current Idac for the current sink. It will be understood that multiple current sinks may be provided within a single device, to provide multiple output sink currents, e.g. in the above figure ten separate output currents are provided as ISNK<9:0>. It will be understood that the V2I converter and IDAC may be used to generate separate Idac reference currents for each current sink.

The current sink comprises an amplifier and multiple switch devices, e.g. MOSFETS as illustrated above.

The Idac reference current drives the reference device (1) of the current sink. The Idac reference device current is mirrored and scaled using an output device (100) to provide the output current of the current sink, e.g. the above-illustrated implementation provides an output current of 100 times the Idac reference current. An amplifier is used to force the reference device and output device to have the same Vds voltage.

The sink is further provided with a device to provide overvoltage protection, with an appropriately rated (e.g. 5 Volt) DMOS (diffused metal-oxide semiconductor) such as an EDMOS or an LDMOS used to protect the amplifier and the connected devices. The protection device is used to protect the amplifier inverting input and the output device. The protection device is normally switched on, and has a low voltage DC bias at its gate. The protection device acts as a voltage follower, its source being at a lower voltage than its gate. As EDMOS and LDMOS devices can withstand high drain to gate voltages, potentially damaging voltages at the current sink path can be conducted away from the amplifier inverting input and the output device by the protection device, thus protecting the amplifier and the output device.

The current sink is further provided with a 1-ohm current sense resistor on the Isnk path, to allow for detection of the current through the sink.

Figure 13:
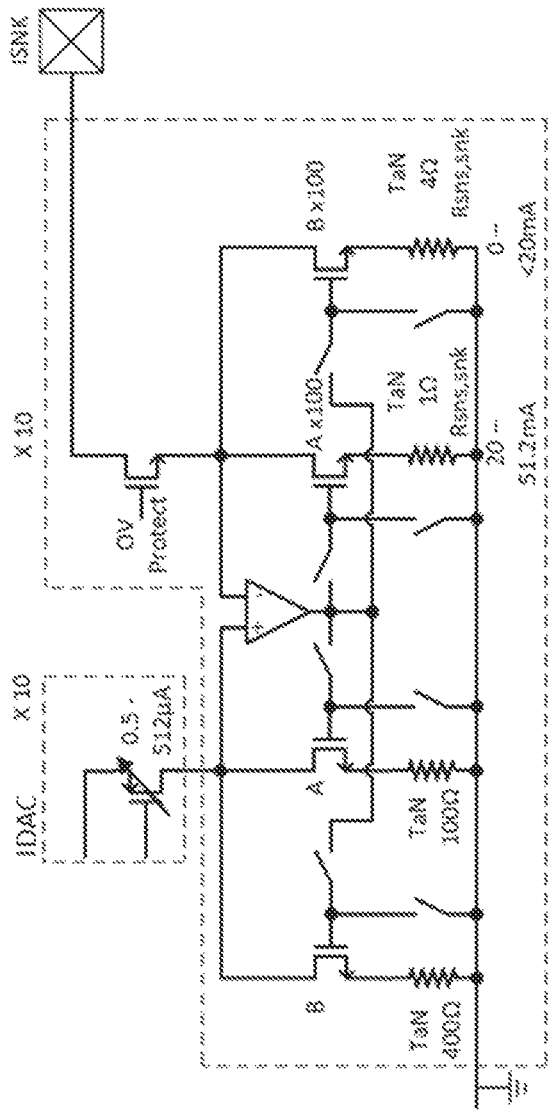
FIG. 13 is a schematic diagram illustrating a further alternative implementation of a current sink system.

A second implementation of current sink is illustrated in FIG. 13, based on the implementation of FIG. 12, with the current sense resistors ground-referenced to ease current sense path design. In the above and in subsequent figures the V2I converter and IDAC are not shown, and are replaced by the device above named IDAC, which will be understood as providing a reference current for the current sink, for example using the approach as shown in FIG. 12.

In situations where the use of a protection device is not possible, adding an additional switch in series with the resistors is not desirable as it will further degrade the available headroom. In such a scenario, two output devices are used as shown above, a large device for high current range (e.g. approximately 20-50 mA) and a second device approx. 60% smaller for low current range (e.g. 0-20 mA). Switches are used to select which output device the amplifier drives.

As two different output devices are being used, the design must also switch between two different reference devices. To match the references to the output device a TaN resistor of ×100 the sense resistor is added to the source of the references.

Figure 14:
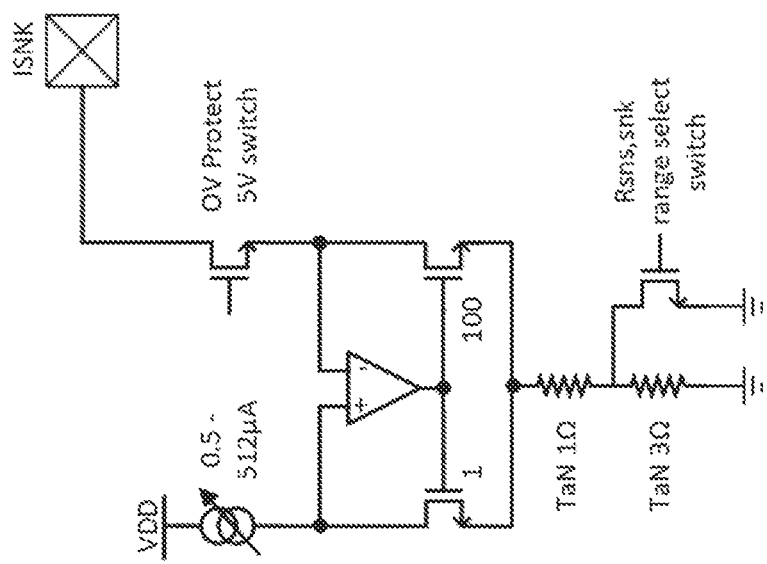
FIG. 14 is a schematic diagram illustrating a further implementation of a current sink system.

FIG. 14 illustrates a simplification of the system of FIG. 13, wherein the range selection is provided using a MOSFET switch arranged to bypass a resistance on the output path. This approach reduces the total number of devices and circuit area required.

Figure 15:
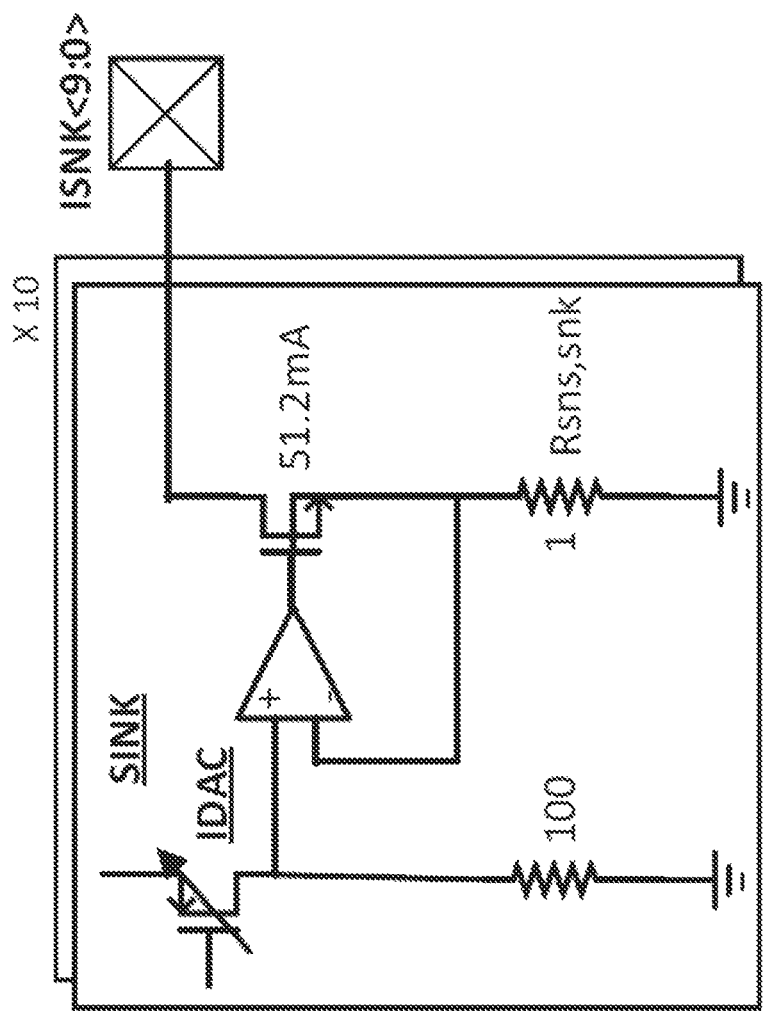
FIG. 15 is a schematic diagram illustrating a further implementation of a current sink system.

FIG. 15 illustrates a further implementation of a current sink.

In the FIG. 15 implementation, the current sense resistor is ground-referenced, to ease the design of the current sense path. An EDMOS device is used as the sink, thereby removing the need for a separate protection device. One amplifier input is taken from the IDAC input, with the other input to the amplifier provided via the sink path, after the EDMOS device, so that the requirement for current mirror matching is removed, and the amplifier doesn't connect to the output pin.

As a result, the implementation of FIG. 15 reduces the headroom requirements relative to the implementation of FIG. 12.

Figure 16:
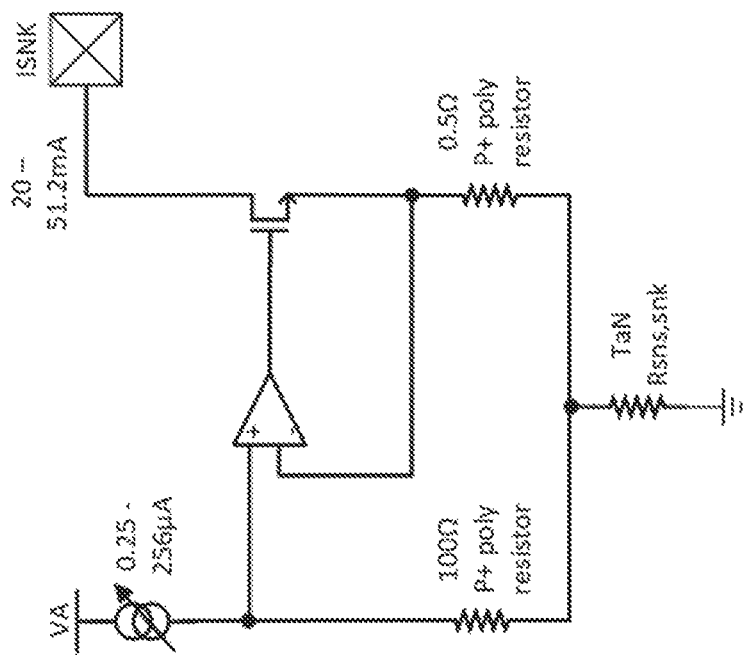
FIG. 16 is a schematic diagram illustrating an alternative to the system of FIG. 15.

A further implementation of current sink is illustrated in FIG. 16.

In this implementation, the IDAC current defines the sink current, as previously described. The IDAC current flows through a first resistor defining the reference voltage for the amplifier, wherein the amplifier outputs a voltage to define the sink current through the sink path, based on feedback voltage taken from the sink path across a sink path resistor.

The inputs to the amplifier are referenced to ground (i.e. the amplifier does not allow for an input swing to the level of the supply voltage)—as a result the amplifier has a relatively narrow common mode input range, thereby allowing a conventional PMOS input stage to be used. As the amplifier is ground-referenced, no relatively high voltages will be input to the amplifier. No additional high voltage protection devices are required, just one high voltage power device. In addition, the headroom requirements for the IDAC current reference are relaxed.

A separate resistor to ground can be used to sense the current through the sink device, preferably a TaN resistor. As a result, the current generation stage and the sensing stages are independent of each other, allowing for improved robustness of design.

Figure 17:
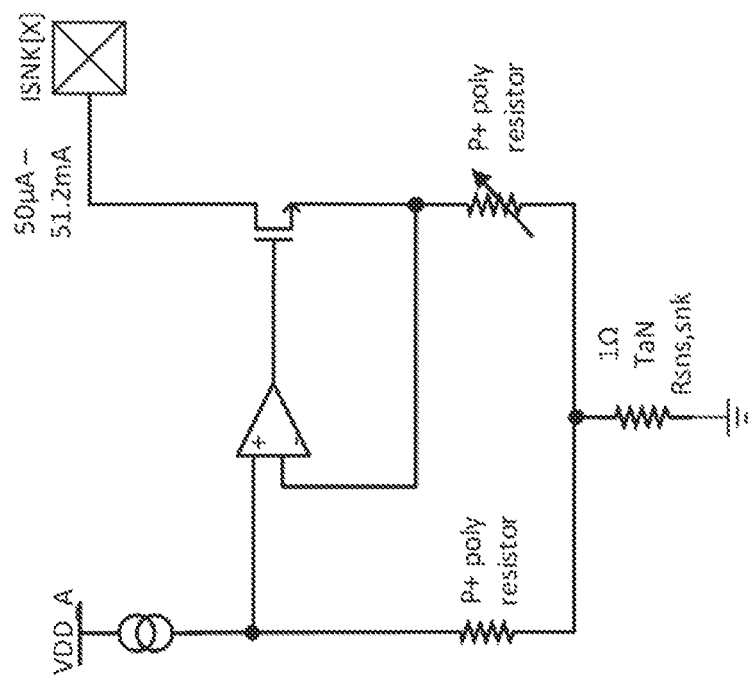
FIG. 17 is a schematic diagram illustrating a further implementation of a current sink system.

An alternative to the system of FIG. 16 is shown in FIG. 17. In such a configuration, the output resistor (referenced as P+ poly resistor in the above, but it will be understood that other resistor types may be used) is configured as the variable element in the form of an RDAC, instead of the variable current source of FIG. 16.

By moving the DAC to a resistor on the output, accordingly this may provide advantages in reducing settling time of the device, as the variability introduced by the RDAC does not significantly impact the slew rate of the system. The settling may be optimized over the full current range of the device, or the gain may be kept constant over the full current range of the device.

A higher resistance of the RDAC may be used at lower currents, which maintains a high gain of the loop and reduced gate movement for steps in the current, e.g. a 50 μA step. A relatively reduced resistance of the RDAC may be used at high currents. Accordingly, the available headroom for the device at high current levels may be relatively unchanged compared to the FIG. 16 implementation. The RDAC may be designed for ~1% resistor matching accuracy.

As a result of using this approach, the input voltage to the amplifier is fixed. Accordingly, the input offset is not signal dependent, and is less dominant on accuracy. The amplifier is effectively bypassed when the resistance of the RDAC is adjusted, and the output stage adjusts to accommodate the change in current through the sink path, such that the amplifier can slew more slowly as the output current is already close to the required level.

Figure 18:
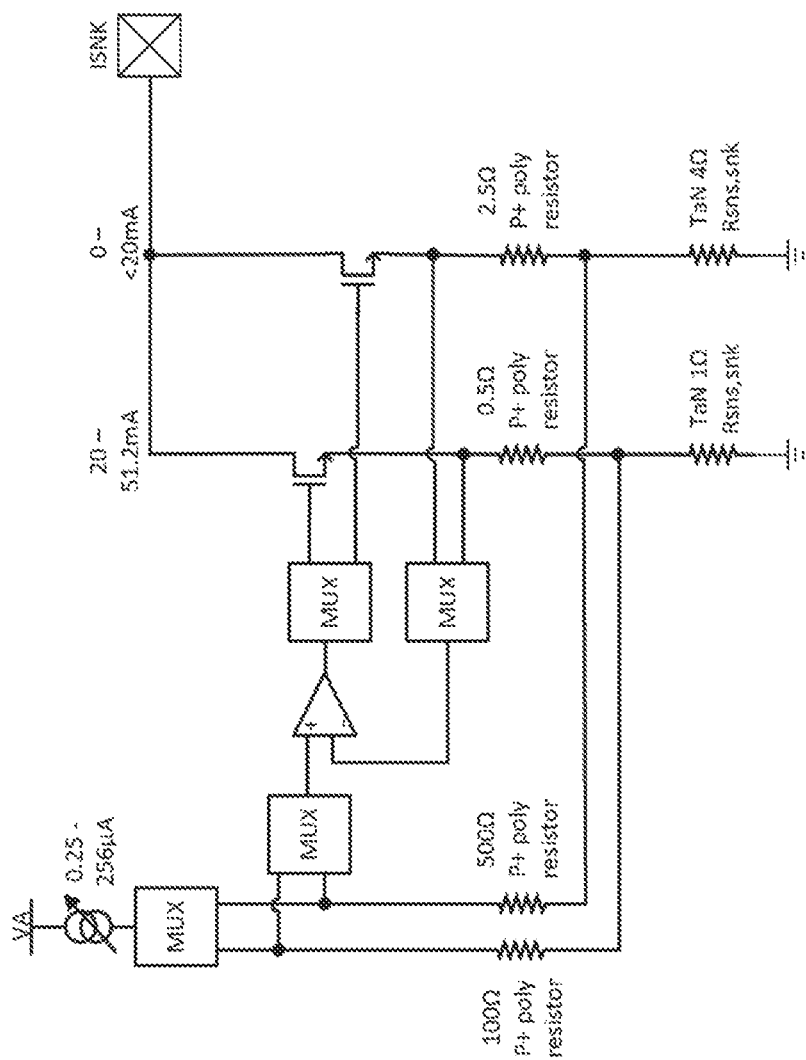
FIG. 18 is a schematic diagram illustrating a further implementation of a current sink system.

A further implementation of current sink is illustrated in FIG. 18. In this implementation, the current sink is provided with two output stages, to allow for a wider range of sink current to be accommodated. An output stage will be understood as meaning a current path or a series of scaled devices which are provided in parallel, or configured to allow for a number of different sink current paths to be defined, the different sink current paths arranged to sink different levels of current.

A pair of parallel current sink paths are provided between ISNK and ground, where the output of the amplifier as well as the feedback input to the amplifier are multiplexed to allow the selection of different current sink paths.

The switch device and/or resistances provided in each path are scaled to allow for the sinking of different current levels in the different paths. In the above figure, the device and resistances in a first path are scaled to allow a first level of sink current, e.g. between 0-20 mA, while the device and resistances in the second path are scaled to allow a relatively larger level of current flow, e.g. between approximately 20-50 mA.

In addition, the current sink device is provided with two reference input stages, wherein the reference current received from the IDAC is multiplexed between two different reference resistances, depending on the output stage used. The reference amplifier input is multiplexed accordingly.

It will be understood that the switching of the above-described current sink paths and current reference paths may be selected based on a target current to be output, and may be controlled using a separate control module (not shown), e.g. a DSP module, an applications processor, or device CPU.

The ranges can be selected to maintain the same reference current and therefore preserve any error formed by the amplifier offset voltage. In addition, the implementation shown above avoids adding switches in the current paths, thereby maintaining a straight ratio for resistors to set the ratio of input to output current. The use of two output stages for the current sink can allow for an improved balance between device headroom and the magnitude of feedback voltage. It will be understood that while two output stages are illustrated in FIG. 16, a current sink device may be provided having a plurality of output stages to allow for a wider range of device sink current.

The above-described current sink implementations provide high-accuracy current sinks having relatively low voltage headroom requirements. The current sinks may be used as current sink drivers for any suitable system, e.g. as a current sink LED driver.

Embodiments of the above-described systems may be implemented in a host device, especially a portable and/or battery powered host device such as a mobile computing device for example a laptop or tablet computer, a wearable device, a games console, a remote control device, a home automation controller or a domestic appliance including a domestic temperature or lighting control system, a toy, a machine such as a robot, an audio player, a video player, or a mobile telephone for example a smartphone. There is further provided a host device incorporating the above-described system. There is further provided a control method for a system as described above.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein.

Aspects of the system may be defined by the following numbered statements:

1. There is provided a current sink driver comprising:
   An input to receive a reference current via a current reference path;
   An output to define a sink current to flow via a current sink path to ground;
   An amplifier having first and second input terminals to generate a sink path voltage, the sink path voltage used to define the sink current;
   Wherein the first amplifier input is coupled with the current reference path, the second amplifier input being feedback connected with the current sink path; and
   wherein the first and second inputs of the amplifier are connected to ground via respective resistances.
   Providing such an amplifier configuration having inputs referenced to ground minimizes amplifier voltage swing.
2. Preferably, the current sink driver comprises a reference path resistor, the first input of the amplifier connected to ground through the reference path resistor.
3. Preferably, the current sink driver comprises a sink path resistor, the second input of the amplifier connected to ground through the sink path resistor.
4. Preferably, the current sink driver comprises a device, e.g. a MOSFET, provided on the current sink path, wherein the output of the amplifier provides the sink path voltage to control the current flow through the device.
5. Additionally or alternatively, the current sink device comprises a plurality of output stages as part of the current sink path, preferably two, wherein the output stages are selectable based on a target sink current.
6. Preferably, the plurality of output stages are configured to allow for different levels of sink current to flow through the current sink path, as defined by the selected output stages.
7. Preferably, the current sink device comprises a plurality of input stages or configurations as part of the reference current path, preferably two, wherein the input stages or configurations are selectable based on the selected output stage.
8. Additionally or alternatively, the current sink driver comprises a feedback resistor and a separate sense resistor provided in the current sink path, such that a current generation operation is separated from a current sensing operation.
9. Preferably, a sensing node is defined between the feedback resistor and the sense resistor, wherein the feedback resistor is connected between the feedback-connected second amplifier input and the sensing node, and the sense resistor is connected between the sensing node and ground, and wherein the sensing node provides a voltage output for monitoring of the current sink driver.
10. In one aspect, the reference current in the current reference path may be provided by a variable current source, e.g. via an IDAC.
11. In an additional or alternative aspect, the feedback resistor may be provided as a variable resistance, e.g. an RDAC.
12. There is provided a host device comprising a current sink driver as described above.

The invention claimed is:
1. Current control circuitry for controlling a current through a load, the current control circuitry comprising:
   amplifier circuitry;
   reference voltage generator circuitry configured to supply a fixed reference voltage to a first input of the amplifier circuitry;
   an output stage comprising:
     a control terminal coupled to an output of the amplifier circuitry;
     a current input terminal configured to be coupled to the load; and
     a current output terminal;
   a variable resistance coupled to the current output terminal of the output stage; and
   a feedback path between the current output terminal of the output stage and a second terminal of the amplifier circuitry for providing a feedback voltage to a second input of the amplifier circuitry;
   wherein the variable resistance comprises a resistive digital to analogue converter (DAC), wherein a resistance of the resistive DAC is based on a digital code input to the resistive DAC; and
   wherein the current control circuitry further comprises a switch, and wherein the switch is operable to couple the first and second inputs of the amplifier circuitry during a change from one digital code input to the resistive DAC to another digital code input to the resistive DAC.
2. Current control circuitry according to claim 1, wherein the reference voltage generator circuitry comprises:
   a current source configured to generate a fixed current; and
   a resistance.
3. Current control circuitry according to claim 1, wherein the output stage comprises a MOSFET device.
4. Current control circuitry according to claim 1, wherein a resistance value of the variable resistance is digitally controllable.
5. Current control circuitry according to claim 1, wherein the resistive DAC is configured to receive a clock signal, and wherein a change in a resistance of the resistive DAC in response to a change in the digital code input to the resistive DAC is synchronised to the clock signal.
6. Current control circuitry according to claim 1, further comprising a current sense resistor coupled in series between the variable resistance and ground, wherein the current sense signal is configured to generate a signal indicative of the current through the load.

7. Current control circuitry according to claim 6, further comprising processing circuitry configured to adjust the operation of the current control circuitry based on the signal indicative of the current through the load.

8. Current control circuitry according to claim 7, wherein the processing circuitry is configured to reduce a supply voltage or power down the current control circuitry in response to determining that the current through the load exceeds a predetermined threshold.

9. Current control circuitry according to claim 7, wherein the processing circuitry is configured to adjust an operating parameter of the current control circuitry to reduce an error between a measured current through the load and a predefined current value.

10. Current control circuitry according to claim 9, wherein the processing circuitry is operative to adjust one or more of:
- a gain of the amplifier circuitry;
- a reference current that is used to generate the reference voltage;
- a resistance value of a resistance that is used to generate the reference voltage
- a supply voltage to a portion of the current control circuitry; and
- a resistance value of the variable resistance.

11. Current control circuitry according to claim 6, wherein the current sense resistor is of a different type than the variable resistance.

12. Current control circuitry according to claim 11, wherein the current sense resistor is a TaN (tantalum nitride) resistor.

13. Current control circuitry according to claim 1, wherein the current control circuitry is configured to receive a first power supply voltage for powering the reference voltage generator circuitry and a second power supply voltage for supplying current to the load.

14. Current control circuitry according to claim 1, wherein the load is a light emitting diode (LED).

15. An integrated circuit comprising current control circuitry according to claim 1.

16. An electronic device comprising an integrated circuit according to claim 15.

17. An electronic device according to claim 16, wherein the device comprises a mobile telephone, a tablet or laptop computer, a wearable device, a gaming device, a virtual reality or augmented reality device.

18. Current control circuitry for controlling a current through a load, the current control circuitry comprising:
- amplifier circuitry;
- reference voltage generator circuitry configured to supply a reference voltage to a first input of the amplifier circuitry;
- an output stage comprising:
  - a control terminal coupled to an output of the amplifier circuitry;
  - a current input terminal configured to be coupled to the load; and
  - a current output terminal;
- a feedback path between the current output terminal of the output stage and a second terminal of the amplifier circuitry for providing a feedback voltage to a second input of the amplifier circuitry; and
- a current sense resistor coupled to ground in a current path for the load current.

19. Current control circuitry for controlling a current through a load, the current control circuitry comprising:
- amplifier circuitry;
- reference voltage generator circuitry configured to supply a fixed reference voltage to a first input of the amplifier circuitry;
- an output stage comprising:
  - a control terminal coupled to an output of the amplifier circuitry;
  - a current input terminal configured to be coupled to the load; and
  - a current output terminal;
- a variable resistance coupled to the current output terminal of the output stage;
- a feedback path between the current output terminal of the output stage and a second terminal of the amplifier circuitry for providing a feedback voltage to a second input of the amplifier circuitry;
- a current sense resistor coupled in series between the variable resistance and ground, wherein the current sense signal is configured to generate a signal indicative of the current through the load; and
- processing circuitry configured to adjust the operation of the current control circuitry based on the signal indicative of the current through the load.

* * * * *